(12) United States Patent
Tsai et al.

(10) Patent No.: US 6,696,325 B1
(45) Date of Patent: Feb. 24, 2004

(54) METHOD OF TRANSFERRING A THIN FILM DEVICE ONTO A PLASTIC SHEET AND METHOD OF FORMING A FLEXIBLE LIQUID CRYSTAL DISPLAY

(75) Inventors: Yaw-Ming Tsai, Taichung Hsien (TW); Chun Hsiang Fang, Yilan Hsien (TW); Cheng-Hsun Tsai, Taichung Hsien (TW)

(73) Assignee: Toppoly Optoelectronics Corp., Chu-Nan (TW)

( * ) Notice: Subject to any disclaimer, the term of this patent is extended or adjusted under 35 U.S.C. 154(b) by 0 days.

(21) Appl. No.: 10/424,464

(22) Filed: Apr. 28, 2003

(30) Foreign Application Priority Data

Feb. 27, 2003 (TW) .................................. 92104184 A

(51) Int. Cl.[7] .............................................. H01L 21/00
(52) U.S. Cl. ...................... 438/149; 438/459; 438/977
(58) Field of Search .......................... 438/30, 149, 406, 438/455, 458, 459, 977

(56) References Cited

U.S. PATENT DOCUMENTS

| | | | |
|---|---|---|---|
| 6,339,010 B2 | * | 1/2002 | Sameshima ................. 438/977 |
| 6,372,608 B1 | | 4/2002 | Shimoda et al. |
| 6,498,114 B1 | * | 12/2002 | Amundson et al. ......... 438/455 |
| 2003/0064569 A1 | * | 4/2003 | Takayama et al. .......... 438/459 |
| 2003/0170965 A1 | * | 9/2003 | Kondo ........................ 438/459 |

OTHER PUBLICATIONS

Yuxiao Zeng, et al, "Processing and encapsulation of silver patterns by using eactive ion etch and ammonia anneal", Materials Chemistry and Physics 66 (2000), pp. 77–82, US.

S. Utsunomiya, et al, "Low Temperature Poly–Si TFT–LCD Transferred onto Plastic Substrate Using Surface Free Technology by Laser Ablation/Annealing (SUFTLA®)", Asia Display/IDW (2001), pp. 339–342, JP.

Akihiko Asano, et al, "Low–Temperature Polycrystalline–Silicon TFT Color LCD Panel Made of Plastic Substates", SID 02 Digest (2002), pp. 1196–1199, JP.

* cited by examiner

*Primary Examiner*—Chandra Chaudhari
(74) *Attorney, Agent, or Firm*—Nelson A. Quintero

(57) ABSTRACT

A method of transferring a thin film device onto a plastic sheet. A silver-containing buffer layer is formed on a glass substrate. A transferred layer including a thin film device is formed on part of the silver-containing buffer layer. At least one first hole penetrates the transferred layer and an edge of the silver-containing buffer layer is exposed. A first plastic layer including at least one second hole is adhered to the transferred layer with a removable glue, wherein the second hole corresponds to the first hole, and part of the first plastic layer is located above the edge of the silver-containing buffer layer. The silver-containing buffer layer is oxidized to expand, thereby separating the silver-containing buffer layer from the transferred layer. A second plastic layer is adhered to the transferred layer. The removable glue is eliminated to remove the first plastic layer.

20 Claims, 5 Drawing Sheets

METHOD OF TRANSFERRING A THIN FILM DEVICE ONTO A PLASTIC SHEET AND METHOD OF FORMING A FLEXIBLE LIQUID CRYSTAL DISPLAY

BACKGROUND OF THE INVENTION

1. Field of the Invention

The present invention relates to a plastic display process, and more particularly, to a method of transferring a thin film device, such as a thin film transistor (TFT), onto a plastic sheet adapted for use in a plastic display process.

2. Description of the Related Art

Liquid crystal displays (LCDs) have been widely adopted as information displays in, for example, calculators, watches, video games, audio and video equipment, portable computers, car dashboards, and the like. LCDs are also widely used in mobile devices especially where low weight is a desired feature.

The substrates used in such devices are typically glass plates having a thickness in the range from 0.7 to 1.1 mm. Due to the high specific weight of glass, the total weight of a display is mainly determined by the size and thickness of the glass plate used. Additionally, glass plates are hard to bend, and hinder LCDs from achieving flexibility. Therefore, it is important to investigate a light and flexible material for use in substrates.

In some applications, plastic sheets are used as low-weight substrates in LCDs. The high strength and flexibility of plastics enable the manufacture of flexible displays. However, during the high temperature thermal process of manufacturing an active device, such as forming a thin film transistor (TFT) directly on a plastic sheet, the plastic sheet will be subjected to stress and strain. That is, because the difference of the expansion coefficient between the plastic sheet and the thin film of a TFT is very great, the thin film can separate or crack during repeated thermal cycle processes, seriously affecting device reliability and yield.

In U.S. Pat. No. 6,372,608 and in the article entitled "Low Temperature Poly-Si TFT LCD Transferred onto Plastic Substrate Using Surface Free Technology by Laser Ablation/Annealing" in the Journal of Asia Display/IDW 2001, pp. 339–342, Shimoda et al disclose an exfoliating method for dividing a thin film device from a glass substrate by high energy laser beam. Though effective, this method nevertheless requires expensive laser equipment.

In the article entitled "Low Temperature Polycrystalline-Silicon TFT Color LCD Panel Made of Plastic Substrates" in the Journal of SID DIGEST 2002, pp. 1196–1199, Asano et al disclose an exfoliating method for dividing a thin film device from a glass substrate by HF etching. This method, however, presents the problems of thin film device damage caused by strong acid and a dangerous working environment.

SUMMARY OF THE INVENTION

The object of the present invention is to provide a method of forming a flexible LCD.

Another object of the present invention is to provide a method of transferring a thin film device, such as a thin film transistor (TFT), onto a plastic sheet adapted for use in a flexible display process, without damage due to excessive heat in the TFT process.

In order to achieve these objects, the present invention provides a method of transferring a thin film device onto a plastic sheet. A silver-containing buffer layer is formed on a glass substrate. A transferred layer including a thin film device is formed on part of the silver-containing buffer layer, wherein at least one first hole penetrates the transferred layer to expose the silver-containing buffer layer and an edge of the silver-containing buffer layer is also exposed. A first plastic layer including at least one second hole is adhered to the transferred layer with a removable glue, wherein the second hole corresponds to the first hole, and part of the first plastic layer is located above the edge of the silver-containing buffer layer. The silver-containing buffer layer is oxidized to expand, thereby separating the silver-containing buffer layer from the transferred layer. A second plastic layer is adhered to the transferred layer. The removable glue is eliminated to remove the first plastic layer.

The present invention improves on the prior art in that the present method utilizes the expansive property of silver to transfer the thin film device from the glass plate onto a plastic sheet without damage due to excessive heat in the TFT process. Thus, the invention is suitable for the fabrication of flexible plastic displays. In addition, the present method does not require expensive laser equipment and strong acid to remove the glass plate, thereby reducing costs, improving workplace safety and ameliorating the disadvantages of the prior art.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The present invention provides a method of transferring a thin film device, such as a thin film transistor (TFT) and a thin film diode (TFD), onto a plastic sheet adapted for use in a flexible TFT plastic display process. Hereinafter, as a demonstrative example, the method of transferring a TFT array serving as a pixel driving element array onto a plastic sheet is described.

FIGS. 1–6 are sectional views according to the present invention, which represent the different steps of the method for the transferring method.

Figure 1:
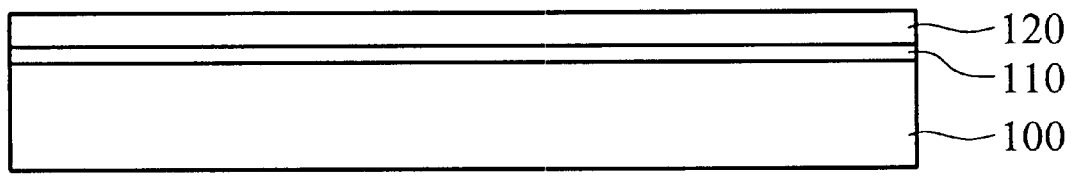
FIGS. 1–6 are sectional views illustrating a fabrication process for transferring a thin film device onto a plastic layer, according to an embodiment of the present invention.

In FIG. 1, a silicon oxide layer ($SiO_x$) 110 and a silver (Ag)-containing buffer layer 120 are sequentially formed on a substrate 100. The adhesion strength between the glass substrate 100 and the silver-containing buffer layer 120 can be improved by means of the silicon oxide layer 110 formed therebetween. The substrate 100 is preferably a heat-resistant glass substrate. The silicon oxide layer 110 can be a $SiO_2$ layer with a thickness of about 200~1000 angstroms, formed by chemical vapor deposition (CVD). The silver-containing buffer layer 120 can be a silver (Ag) layer with a thickness of about 2000~5000 angstroms, formed by sputtering.

Figure 2A:
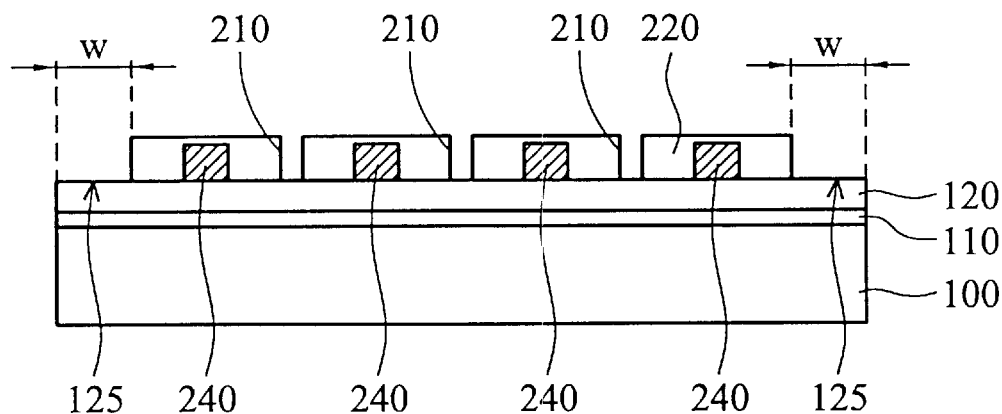

In FIG. 2A, a transferred layer 220 including a plurality TFT (a TFT array) 240 is formed on part of the silver-containing buffer layer 120. It should be noted that at least one first hole (through hole) 210 penetrates the transferred layer 220 to expose the silver-containing buffer layer 120 with in the hole 210. Also, an edge 125 of the silver-containing buffer layer 120 is exposed. Preferably, a width "w" of the edge 125 of the silver-containing buffer layer 120 is about 10~20 mm. More preferably, the width "w" is 15 mm.

Figure 2B:
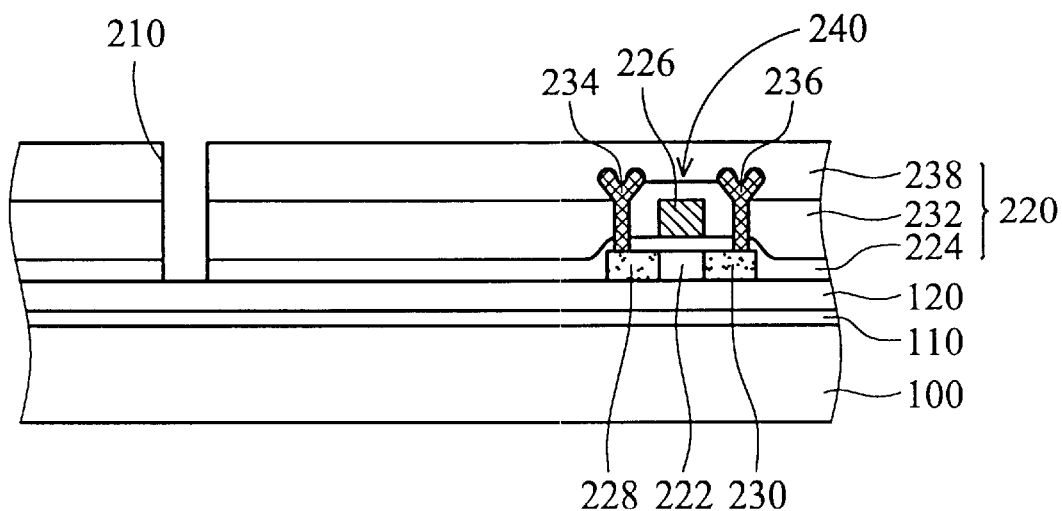

An example process for forming the TFT 240 is herein described. That is, the TFT structure can be a bottom gate type or a top gate type. FIG. 2B shows the manufacturing process of the top gate type TFT, but is not intended to limit the present invention. By CVD, a buffer layer (not shown) of $SiO_2$ or SiN is formed on the silver-containing buffer layer 120. Then, a semiconductor layer 222, serving as a channel layer, is formed on part of the buffer layer (not shown). The semiconductor layer 222 can be a silicon layer formed by deposition and patterning procedures.

Next, a gate insulating layer 224 is formed on the semiconductor layer 220 and the silver-containing buffer layer 120. The gate insulating layer 224 can be a $SiO_2$ layer formed by CVD. Then, a gate 226 is formed on part of the gate insulating layer 224 by deposition and patterning procedures. The gate 226 can be a doped polysilicon, metal or alloy layer. Using the gate 226 as a mask, an ion implantation is then performed to the semiconductor layer 220. A source region 228 and a grain region 230 are thus formed in the semiconductor layer 222 beside the gate 226.

Next, an insulating interlayer 232, such as a $SiO_2$ layer, is deposited on the gate 226 and the gate insulating layer 224. Then, by performing photolithography, etching and deposition procedures, a source electrode 234 electrically connecting the source region 228 and a drain electrode 236 electrically connecting the source region 230 are formed. Thus, a TFT array 240 is obtained.

Next, a passivation layer 238 is formed on the TFT array 240 and the insulating interlayer 232. The passivation layer 238 can be a SiN, $SiO_2$, PSG (phosphosilicate glass) or BPSG (boron doped PSG) layer formed by deposition. Moreover, a planarization procedure can be performed to smooth the surface of the passivation layer 238. Thus, referring to FIG. 2B, the transferred layer 220 including the TFT array 240 consists of insulating material (i.e. insulating layers 224, 232 and 238).

It should be noted that the hole 210, exposing the silver-containing buffer layer 120 therein, can be beforehand formed after depositing each insulating layer (i.e. the gate insulating layer 224, the insulating interlayer 232 or the passivation layer 238). Nevertheless, the hole 210 also can be formed after depositing the transferred layer 220 by performing a photolithography procedure. That is, the purpose of this step is to form the hole 210 and expose the silver-containing buffer layer 120 therein. The method of forming the hole 210 does not limit the scope of the present invention.

In addition, the position of the hole 210 is preferably located at the predetermined scribe line of the LCD panel, avoiding damage to the pixel regions.

Figure 3:
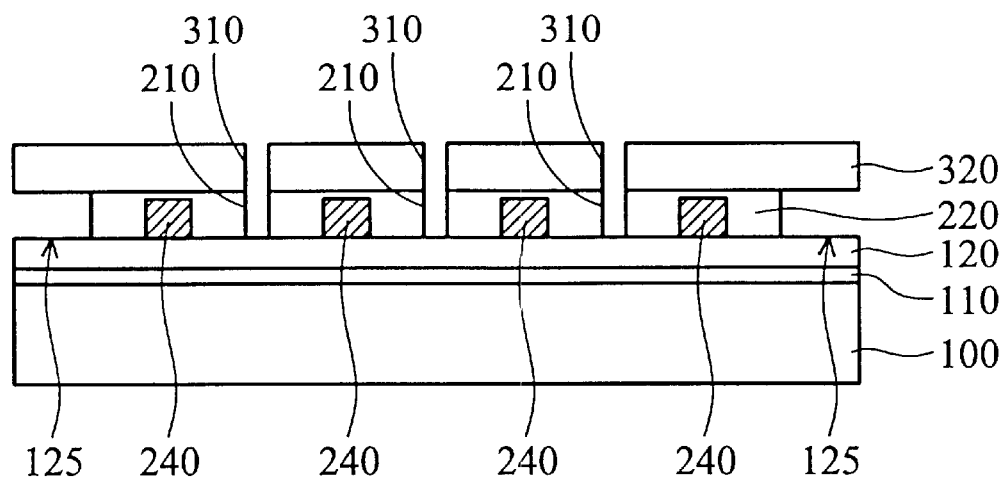

In FIG. 3, a first plastic layer 320 including at least one second hole 310 is adhered to the transferred layer 220 with a removable glue. The thickness of the first plastic layer 320 is about 0.4 mm. An example of such removable glue is KAYATORON ML-3600P5A water-soluble glue made by Nippon Kayaku Company. The second hole 310 corresponds to the first hole 210, and part of the first plastic layer 320 is located above the edge 125 of the silver-containing buffer layer 120. It is preferred that there is at least one alignment mark (not shown) respectively formed on the transferred layer 220 and the first plastic layer 320, so as to precisely correspond to each other. Caution should be exercised when spreading the removable glue as it should not exist in the holes 210 and 310.

Figure 4:
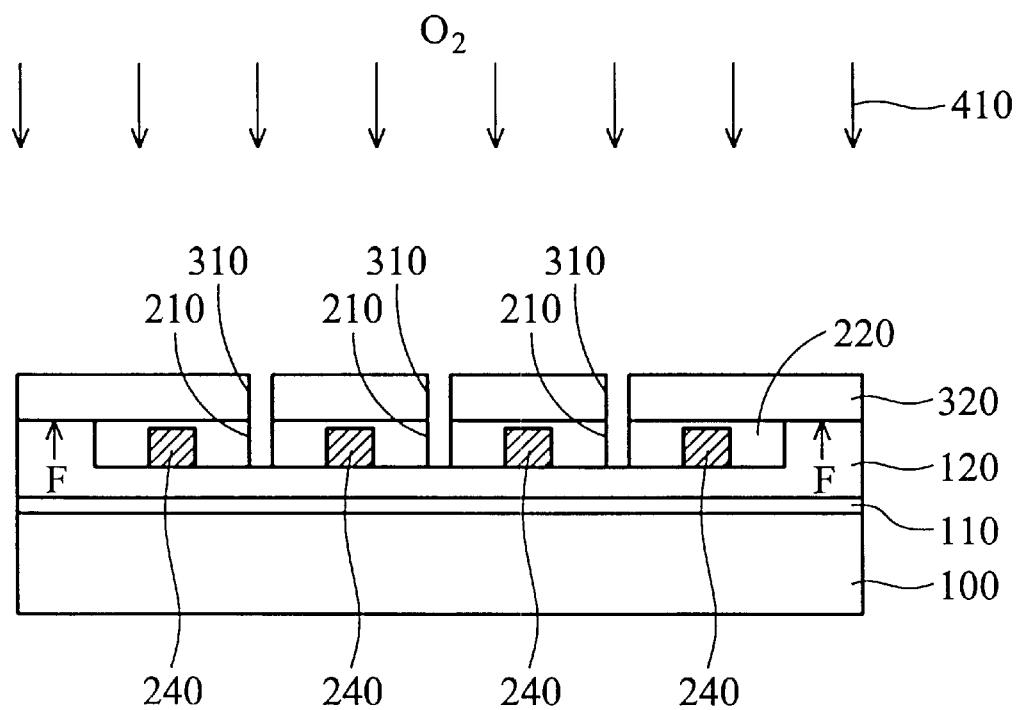
Figure 5:
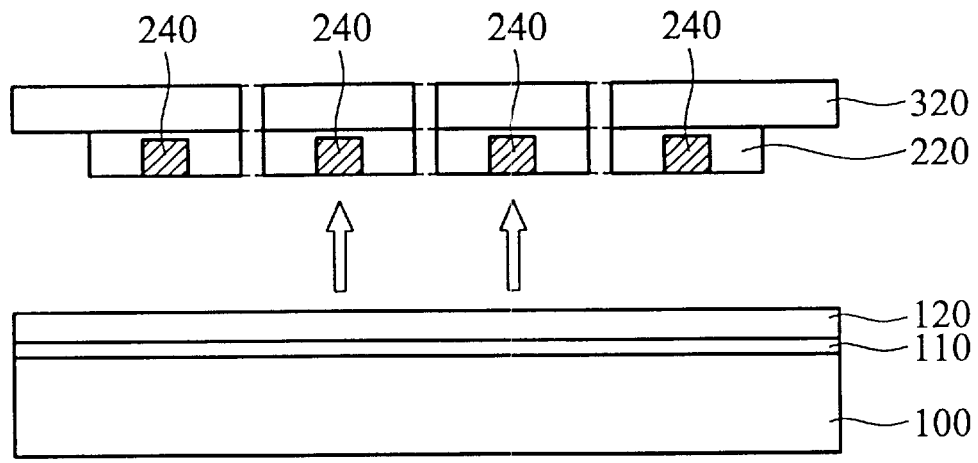

In FIG. 4, the silver-containing buffer layer 120 (i.e. the edge 125 and the portion in the hole 210) is oxidized to expand, thereby separating (or ablating) the silver-containing buffer layer 120 from the transferred layer 220. The oxidizing method is, for example, an oxygen plasma procedure 410. Thus, the transferred layer 220 is separated from the glass substrate 100, as shown as FIG. 5.

FIG. 4 shows the expansion of the edge 125 of the silver-containing buffer layer 120 during oxidation, thereby causing a thrust "F" to push the transferred layer 220 and the first plastic layer 320. The silver-containing buffer layer 120 in the hole 210 also expands during oxidation, thereby accelerating ablation. Furthermore, the oxygen plasma procedure 410 will induce internal stress/strain into the silver-containing buffer layer 120, thereby accelerating ablation. The operation of the oxygen plasma procedure 410 may be under the conditions of 100~150° C., 1~2 Pa and 3000~5000 W for RF power.

Figure 6:
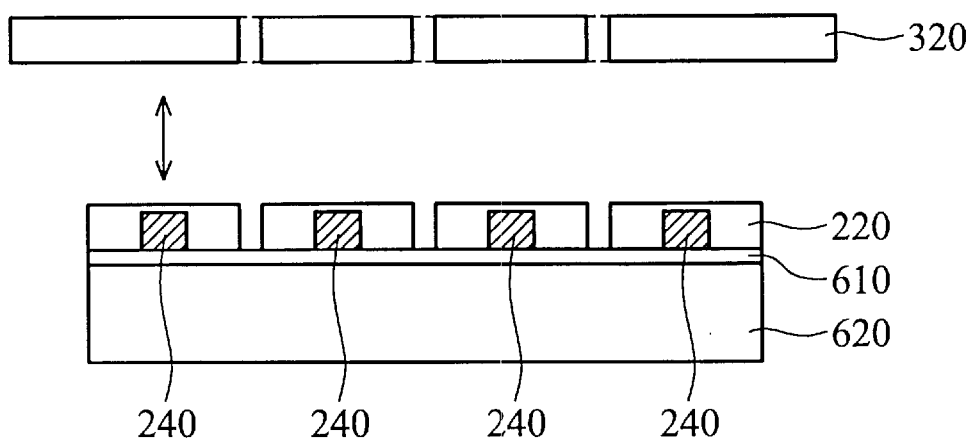

In FIG. 6, a second plastic layer 620 is adhered to the transferred layer 220 with a permanent adhesive 610. The thickness of the second plastic layer 620 is about 0.4 mm. An example of such permanent adhesive is TB3021J non water-soluble adhesive made by Three Bond Company. Since the glue is water-soluble, the first plastic layer 320 is then removed. The first or second plastic layer 320 or 620 can be a heat sensitive material, such as PET, PC, Epoxy, or the like. Thus, the thin film device 240 formed on the heat sensitive plastic layer 620 (serving as a lower substrate) is obtained.

Figure 7:
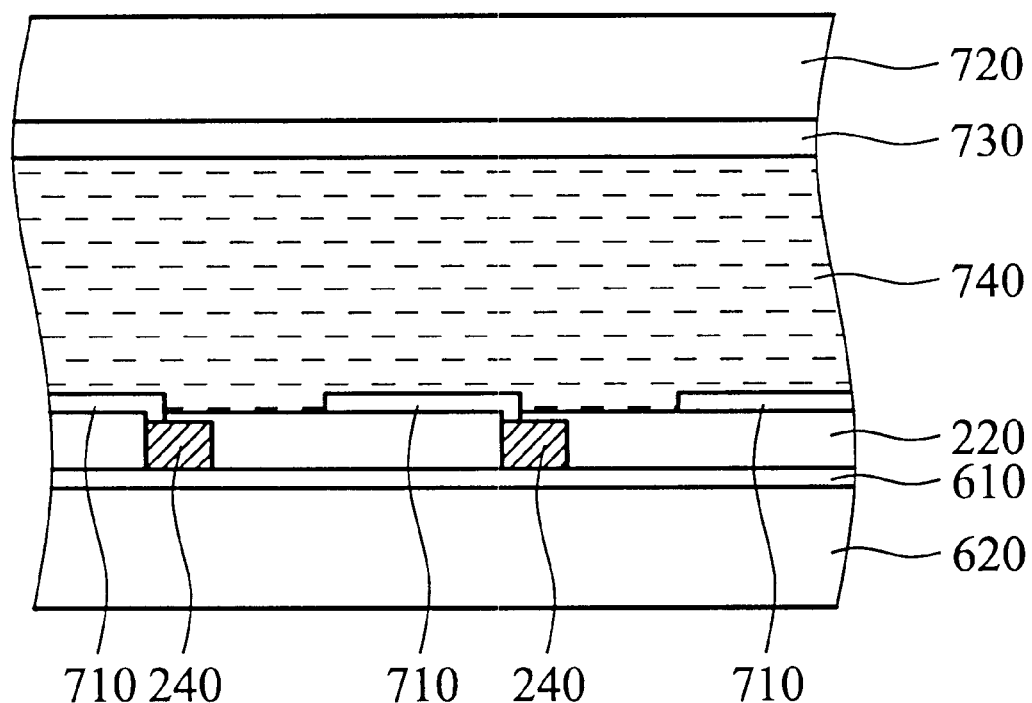
FIG. 7 is a sectional view showing the application of the present invention to a flexible plastic LCD.

FIG. 7 is a sectional view showing the application of the present invention to a flexible plastic LCD. Aplurality of pixel electrodes 710 are formed on the transferred layer 220 and electrically connect the source electrode 234 or the drain electrode 236 of the TFT array 240. The pixel electrodes 710 are indium tin oxide (ITO) or Al electrodes. A transparent flexible plate 720 opposite the second plastic layer 620 (lower substrate) is provided. The plate 720 serves as an upper substrate. A common electrode 730, such as an ITO layer, is formed on the interior side of the plate 720. Then, liquid crystal material is filled in the space between the second plastic layer 620 (lower substrate) and the transparent flexible plate 720 (upper substrate) to form a display layer 740.

Thus, the present invention can transfer the thin film device from the glass plate onto a plastic sheet without damage due to the high process temperature of the thin film device in the manufacturing process. The invention is well suited for use in the fabrication of flexible plastic displays. In addition, the present method does not require expensive laser equipment and strong acid to remove the glass plate, thereby reducing costs, improving workplace safety and ameliorating the disadvantages of the prior art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of transferring a thin film device onto a plastic sheet, comprising steps of:

providing a glass substrate;

forming a silver-containing buffer layer on the glass substrate;

forming a transferred layer including a thin film device on part of the silver-containing buffer layer, wherein at least one first hole penetrates the transferred layer to expose the silver-containing buffer layer and an edge of the silver-containing buffer layer is exposed;

adhering a first plastic layer including at least one second hole to the transferred layer with a removable glue, wherein the second hole corresponds to the first hole, and part of the first plastic layer is located above the edge of the silver-containing buffer layer;

oxidizing the silver-containing buffer layer to expand, thereby separating the silver-containing buffer layer from the transferred layer;

adhering a second plastic layer to the transferred layer; and eliminating the removable glue to remove the first plastic layer.

2. The method according to claim 1, further comprising the step of:

forming a silicon oxide layer ($SiO_x$) on the glass substrate.

3. The method according to claim 1, wherein a thickness of the silver-containing buffer layer is 2000~5000 angstroms.

4. The method according to claim 1, wherein the silver-containing buffer layer includes an insulating layer.

5. The method according to claim 1, wherein the thin film device is a thin film transistor device.

6. The method according to claim 1, wherein a width of the edge of the silver-containing buffer layer is 10~20 mm.

7. The method according to claim 1, wherein the removable glue is water-soluble.

8. The method according to claim 1, wherein a method of oxidizing the silver-containing buffer layer includes an oxygen plasma procedure.

9. The method according to claim 1, wherein the second plastic layer is adhered on the transferred layer with a permanent adhesive.

10. The method according to claim 9, wherein the permanent adhesive is non water-soluble.

11. A method of forming a flexible liquid crystal display, comprising steps of:

providing a glass substrate;

forming a silver-containing buffer layer on the glass substrate;

forming a transferred layer including a pixel driving element array on part of the silver-containing buffer layer, wherein at least one first hole penetrates the transferred layer to expose the silver-containing buffer layer and an edge of the silver-containing buffer layer is exposed;

adhering a first plastic layer including at least one second hole to the transferred layer with a removable glue, wherein the second hole corresponds to the first hole, and part of the first plastic layer is located above the edge of the silver-containing buffer layer;

oxidizing the silver-containing buffer layer to expand, thereby separating the silver-containing buffer layer from the transferred layer;

adhering a second plastic layer to the transferred layer; and eliminating the removable glue to remove the first plastic layer.

12. The method according to claim 11, further comprising the step of:

forming a silicon oxide layer ($SiO_x$) on the glass substrate.

13. The method according to claim 11, wherein a thickness of the silver-containing buffer layer is 2000~5000 angstroms.

14. The method according to claim 11, wherein the pixel driving element array is a thin film transistor array.

15. The method according to claim 11, wherein a width of the edge of the silver-containing buffer layer is 10~20 mm.

16. A method of transferring a thin film device onto a plastic sheet, comprising steps of:

providing a glass substrate;

forming a silicon oxide layer ($SiO_x$) on the glass substrate;

forming a silver-containing buffer layer on the silicon oxide layer;

forming a transferred layer including a thin film device on part of the silver-containing buffer layer, wherein at least one first hole penetrates the transferred layer to expose the silver-containing buffer layer and an edge of the silver-containing buffer layer is exposed;

adhering a first plastic layer including at least one second hole to the transferred layer with a water-soluble glue, wherein the second hole corresponds to the first hole, and part of the first plastic layer is located above the edge of the silver-containing buffer layer;

using oxygen plasma, oxidizing the silver-containing buffer layer to expand, thereby separating the silver-containing buffer layer from the transferred layer;

adhering a second plastic layer to the transferred layer with a non water-soluble adhesive; and eliminating the water-soluble glue to remove the first plastic layer.

17. The method according to claim 16, wherein a thickness of the silver-containing buffer layer is 2000~5000 angstroms.

18. The method according to claim 16, wherein the silver-containing buffer layer includes an insulating layer.

19. The method according to claim 16, wherein the thin film device is a thin film transistor.

20. The method according to claim 16, wherein a width of the edge of the silver-containing buffer layer is 10~20 mm.

* * * * *